US011403198B2

(12) United States Patent
Dalmatov

(10) Patent No.: US 11,403,198 B2
(45) Date of Patent: Aug. 2, 2022

(54) MANAGING DATA WITHIN SOLID STATE DRIVE STORAGE BASED ON RECURRING WRITE QUOTAS

(71) Applicant: EMC IP Holding Company LLC, Hopkinton, MA (US)

(72) Inventor: Nickolay Alexandrovich Dalmatov, Saint Petersburg (RU)

(73) Assignee: EMC IP Holding Company LLC, Hopkinton, MA (US)

( * ) Notice: Subject to any disclaimer, the term of this patent is extended or adjusted under 35 U.S.C. 154(b) by 1072 days.

(21) Appl. No.: 16/066,504

(22) PCT Filed: Jul. 27, 2017

(86) PCT No.: PCT/RU2017/000558
§ 371 (c)(1),
(2) Date: Jun. 27, 2018

(87) PCT Pub. No.: WO2019/022633
PCT Pub. Date: Jan. 31, 2019

(65) Prior Publication Data
US 2021/0173754 A1    Jun. 10, 2021

(51) Int. Cl.
G06F 11/30    (2006.01)
G06F 3/06    (2006.01)
(Continued)

(52) U.S. Cl.
CPC ........ *G06F 11/3034* (2013.01); *G06F 3/0619* (2013.01); *G06F 3/0652* (2013.01);
(Continued)

(58) Field of Classification Search
CPC .. G06F 11/3034; G06F 11/076; G06F 11/108; G06F 11/327; G06F 3/0619; G06F 3/0652; G06F 3/0688
See application file for complete search history.

(56) References Cited

U.S. PATENT DOCUMENTS 8,010,738 B1    8/2011  Chilton et al.
8,046,551 B1   10/2011  Sahin
(Continued)

FOREIGN PATENT DOCUMENTS

WO    2010054410    5/2010

OTHER PUBLICATIONS

International Search Report and the Written Opinion from International Searching Authority (RU) for International Application No. PCT/RU2017/000558, dated Apr. 26, 2018, 8 pages.

*Primary Examiner* — Matthew M Kim
*Assistant Examiner* — Matthew N Putaraksa
(74) *Attorney, Agent, or Firm* — BainwoodHuang

(57) ABSTRACT

A technique manages data within solid state device (SSD) storage. The technique involves, in response to writing data to a set of SSD storage components, consuming a set of recurring write quotas for the set of SSD storage components. Each recurring write quota identifies an amount of remaining usefulness for a respective SSD storage component, e.g., periodically allocated budgets for write operations based on measured (or counted) reliability and/or healthiness factors. The technique further involves, as the set of recurring write quotas are consumed, performing a set of quota evaluation operations to evaluate the set of recurring write quotas. The technique further involves, in response to a set of results from the set of quota evaluation operations, performing a set of remedial activities to control access to the data that was written to the set of SSD storage components.

20 Claims, 5 Drawing Sheets

(51) Int. Cl.
   *G06F 11/07*     (2006.01)
   *G06F 11/10*     (2006.01)
   *G06F 11/32*     (2006.01)

(52) U.S. Cl.
   CPC .......... *G06F 3/0688* (2013.01); *G06F 11/076* (2013.01); *G06F 11/108* (2013.01); *G06F 11/327* (2013.01)

(56) References Cited

U.S. PATENT DOCUMENTS

| | | |
|---|---|---|
| 8,799,705 B2 | 8/2014 | Hallak et al. |
| 8,880,801 B1 | 11/2014 | Robins et al. |
| 9,141,457 B1 | 9/2015 | Ma et al. |
| 9,189,309 B1 | 11/2015 | Ma et al. |
| 9,229,796 B1 | 1/2016 | Ma et al. |
| 9,348,761 B1 | 5/2016 | Cummins et al. |
| 9,383,936 B1 | 7/2016 | Freitas et al. |
| 9,442,941 B1 | 9/2016 | Luz et al. |
| 9,619,149 B1 | 4/2017 | Cummins et al. |
| 9,652,352 B1 | 5/2017 | Chilton et al. |
| 9,703,664 B1 | 7/2017 | Alshawabkeh et al. |
| 9,836,243 B1 | 12/2017 | Chanler et al. |
| 9,940,033 B1 | 4/2018 | Alshawabkeh et al. |
| 9,946,465 B1 | 4/2018 | Martin et al. |
| 9,946,471 B1 | 4/2018 | More et al. |
| 9,965,218 B1 | 5/2018 | Martin et al. |
| 10,067,840 B1 | 9/2018 | Labaj et al. |
| 10,078,569 B1 | 9/2018 | Alshawabkeh et al. |
| 10,082,965 B1 | 9/2018 | Tamilarasan et al. |
| 10,289,566 B1 | 5/2019 | Dalmatov et al. |
| 10,318,163 B2 | 6/2019 | Dalmatov |
| 10,324,633 B2 | 6/2019 | Dalmatov |
| 10,324,782 B1* | 6/2019 | Dorfman .............. G06F 11/0727 |
| 10,338,825 B2 | 7/2019 | Dalmatov |
| 10,372,372 B2* | 8/2019 | Nakamura ............ G06F 3/0649 |
| 10,387,062 B2* | 8/2019 | Doi ........................ G06F 3/064 |
| 11,133,083 B1* | 9/2021 | Fitzpatrick ............. G11C 29/52 |
| 11,163,651 B1* | 11/2021 | Patil ..................... G06F 11/1448 |
| 11,199,968 B2 | 12/2021 | Dalmatov |
| 11,199,995 B2* | 12/2021 | Gunasekaran ........ G06F 3/0659 |
| 11,228,810 B1* | 1/2022 | Arazi .................. H04N 21/4532 |
| 2005/0044454 A1* | 2/2005 | Moshayedi ......... G06F 11/2094 714/54 |
| 2010/0054410 A1 | 3/2010 | Nord et al. |
| 2011/0029715 A1* | 2/2011 | Hu ....................... G06F 12/0246 711/103 |
| 2011/0099321 A1* | 4/2011 | Haines ................. G06F 12/0246 711/103 |
| 2014/0032834 A1* | 1/2014 | Cudak ................. G06F 11/1092 711/114 |
| 2015/0039832 A1 | 2/2015 | Agarwal et al. |
| 2015/0044454 A1 | 2/2015 | Hasegawa |
| 2015/0062607 A1* | 3/2015 | Higashi ...................... G06F 1/32 358/1.13 |
| 2015/0205668 A1* | 7/2015 | Sundaram ............. G06F 3/0688 714/6.24 |
| 2016/0170882 A1* | 6/2016 | Choi ........................ G06F 3/06 711/119 |
| 2017/0060448 A1* | 3/2017 | Schnarch .............. G06F 3/0652 |
| 2017/0131948 A1* | 5/2017 | Hoang .................. G06F 3/0653 |
| 2017/0337103 A1* | 11/2017 | Royer, Jr. ............. G06F 11/108 |
| 2018/0284997 A1* | 10/2018 | Dalmatov ............. G06F 3/0616 |
| 2018/0287955 A1* | 10/2018 | Fitzgerald ............ H04L 41/0896 |
| 2019/0079676 A1* | 3/2019 | Seo ........................ G06F 3/0611 |
| 2020/0042207 A1* | 2/2020 | Kwak .................... G06F 13/102 |

* cited by examiner

MANAGING DATA WITHIN SOLID STATE DRIVE STORAGE BASED ON RECURRING WRITE QUOTAS

BACKGROUND

Conventional data storage systems maintain host data within storage devices on behalf of one or more host computers. Some conventional data storage systems store host data on flash memory drives.

Flash memory drive vendors typically specify that their flash memory drives should work properly for a specified number of write cycles (i.e., the number of times each page of the flash drive can be written). To avoid exceeding a flash memory drive vendor's write cycle specification, data storage system operators typically schedule proactive flash memory drive replacement to avoid unexpected data loss.

For example, supposed that that a data storage system operator obtains flash memory drives that have been specified to endure 10,000 write cycles and that the data storage system operator expects each page of each flash memory drive to be written 10 times per day (i.e., to endure 10 write cycles per day or WPDs). Accordingly, the data storage system operator may schedule replacement of the flash memory drives in 1000 days (i.e., in just under 3 years).

On the other hand, supposed that that the data storage system operator expects each page of each flash memory drive to be written only 5 times per day (i.e., 5 WPDs). In this situation, the data storage system operator may schedule replacement of the flash memory drives in 2000 days (i.e., in just over 5 years).

SUMMARY

Unfortunately, there are deficiencies to the above-described conventional approach which simply relies on vendor specifications and expected write cycles per day to replace flash memory drives. For example, the data storage system may not write to the flash memory drives evenly thus causing certain flash memory drives to perform more write operations than others. Such uneven flash memory wear may cause some flash memory drives to reach their specified write cycle limit faster than other flash memory drives and ahead of schedule. Accordingly, some flash memory drives may reach their write cycle limit while other flash memory drives have not come close to reaching their write cycle limit when the data storage system operator replaces the flash memory drives in accordance with a schedule that is simply based on vendor specifications and expected write cycles per day.

Additionally, some vendors may specify the write cycle limit for a particular flash memory drive model based on worst case testing. Accordingly, many flash memory drives may be able to significantly outlive the vendor's specified write cycle limit. Along these lines, some studies have shown that healthy flash memory drives (e.g., flash memory drives that have encountered only a few faults if any) may outlive the vendor's specified write cycle limit many times over, e.g., double the write cycle limit, triple the write cycle limit, etc.

In contrast to the above-described conventional approach which may waste flash memory drive endurance capacity by naïvely replacing flash memory drives simply based on vendor specifications and expected write cycles per day, improved techniques are directed to managing data within solid state drive (SSD) storage based on recurring write quotas. Such write quotas are allocated budgets for write operations for a given time period and may be based on a variety of measured (or counted) reliability and/or healthiness factors. Example factors include the number of read errors, the number of write errors, the number of unrecoverable errors, the number of faulted pages, write amplification metrics, and so on. Moreover, when a recurring write quota has been consumed for a particular SSD storage component (e.g., for a RAID group formed by multiple SSDs, for a single SSD, etc.), the data storage system may automatically perform a remedial activity such as block further write operations to that SSD storage component for an amount of time, direct write operations to an alternative SSD storage component to provide even wearing, alert a user, and so on.

One embodiment is directed to a method of managing data within SSD storage. The method includes, in response to writing data to a set of SSD storage components, consuming a set of recurring write quotas for the set of SSD storage components. Each recurring write quota of the set of recurring write quotas identifies an amount of remaining usefulness for a respective SSD storage component of the set of SSD storage components. The method further includes, as the set of recurring write quotas are consumed, performing a set of quota evaluation operations to evaluate the set of recurring write quotas. The method further includes, in response to a set of results from the set of quota evaluation operations, performing a set of remedial activities to control access to the data that was written to the set of SSD storage components.

In some arrangements, the method further includes, prior to consuming the set of recurring write quotas, generating the set of recurring write quotas based on a set of predefined program-erase (PE) cycle counts for the set of SSD storage components. Each predefined PE cycle count identifies a predefined number of PE cycles to be performed on a respective SSD storage component of the set of SSD storage components. In these arrangements, each recurring write quota is a numerical measure of remaining PE usefulness for a respective SSD storage component of the set of SSD storage components.

In some arrangements, performing the set of quota evaluation operations to evaluate the set of recurring write quotas includes providing a particular alert that a particular recurring write quota for a particular SSD storage component has been fully consumed.

In some arrangements, the particular recurring write quota for the particular SSD storage component initially is a numerical write measurement for the particular SSD storage component budgeted for a predefined time period. In these arrangements, performing the set of remedial activities to control access to the data that was written to the set of SSD storage components includes, in response to the particular alert, blocking performance of further write operations to the particular SSD storage component during a remainder of the predefined time period.

In some arrangements, the method further includes, upon expiration of the predefined time period and onset of a new predefined time period, (i) setting the particular recurring write quota for the particular SSD storage component back to the numerical write measurement budgeted for the new predefined time period and (ii) unblocking performance of further write operations to the particular SSD storage component.

In some arrangements, the particular recurring write quota for the particular SSD storage component initially is a numerical write measurement for the particular SSD storage component budgeted for a predefined time period. In these arrangements, performing the set of remedial activities to control access to the data that was written to the set of SSD storage components includes outputting a notification to a user indicating that write operations to the particular SSD storage component within the predefined time period exceeded the numerical write measurement for the particular SSD storage component budgeted for the predefined time period.

In some arrangements, the method further includes, during the predefined time period, continuing to permit performance of further write operations to the particular SSD storage component.

In some arrangements, generating the set of recurring write quotas includes deriving the set of recurring write quotas based on a set of healthiness factors for the set of SSD storage components. Each healthiness factor indicates whether a respective SSD storage component is healthy.

In some arrangements, the method further includes providing the set of healthiness factors based on a count of unrecoverable errors for each SSD storage component of the set of SSD storage components.

In some arrangements, the method further includes providing the set of healthiness factors based on a count of faulted pages for each SSD storage component of the set of SSD storage components.

In some arrangements, the method further includes providing the set of healthiness factors based on a count of read errors for each SSD storage component of the set of SSD storage components.

In some arrangements, the method further includes providing the set of healthiness factors based on a count of write errors for each SSD storage component of the set of SSD storage components.

In some arrangements, the method further includes providing the set of healthiness factors based on a current write amplification factor for each SSD storage component of the set of SSD storage components.

In some arrangements, the method further includes providing the set of healthiness factors based on (i) a count of unrecoverable errors for each SSD storage component of the set of SSD storage components, (ii) a count of faulted pages for each SSD storage component of the set of SSD storage components, (iii) a count of read errors for each SSD storage component of the set of SSD storage components, (iv) a count of write errors for each SSD storage component of the set of SSD storage components, and (v) a current write amplification factor for each SSD storage component of the set of SSD storage components.

In some arrangements, the method further includes, after a predefined period of operation has passed since generating the set of recurring write quotas, replacing the set of recurring write quotas with a set of newly-generated recurring write quotas based on a set of updated healthiness factors for the set of SSD storage components. Each updated healthiness factor indicates whether a respective SSD storage component is currently healthy.

In some arrangements, each SSD storage component includes multiple SSD storage units configured as a redundant array of independent devices (RAID) group.

In some arrangements, each SSD storage component includes exactly one SSD storage unit.

Another embodiment is directed to data storage equipment which includes a storage component interface operative to communicate with a set of solid state drive (SSD) storage components. The data storage equipment further includes memory, and control circuitry coupled to the storage component interface and the memory. The memory stores instructions which, when carried out by the control circuitry, cause the control circuitry to:

(A) in response to writing data to the set of SSD storage components through storage component interface, consuming a set of recurring write quotas for the set of SSD storage components, each recurring write quota of the set of recurring write quotas identifying an amount of remaining usefulness for a respective SSD storage component of the set of SSD storage components, (B) as the set of recurring write quotas are consumed, performing a set of quota evaluation operations to evaluate the set of recurring write quotas, and (C) in response to a set of results from the set of quota evaluation operations, performing a set of remedial activities to control access to the data that was written to the set of SSD storage components.

Yet another embodiment is directed to a computer program product having a non-transitory computer readable medium which stores a set of instructions to manage data within solid state drive (SSD) storage. The set of instructions, when carried out by computerized circuitry, causes the computerized circuitry to perform a method of:

(A) in response to writing data to a set of SSD storage components, consuming a set of recurring write quotas for the set of SSD storage components, each recurring write quota of the set of recurring write quotas identifying an amount of remaining usefulness for a respective SSD storage component of the set of SSD storage components;

(B) as the set of recurring write quotas are consumed, performing a set of quota evaluation operations to evaluate the set of recurring write quotas; and (C) in response to a set of results from the set of quota evaluation operations, performing a set of remedial activities to control access to the data that was written to the set of SSD storage components.

It should be understood that, in the cloud context, at least some of electronic circuitry is formed by remote computer resources distributed over a network. Such an electronic environment is capable of providing certain advantages such as high availability and data protection, transparent operation and enhanced security, big data analysis, etc.

Other embodiments are directed to electronic systems and apparatus, processing circuits, computer program products, and so on. Some embodiments are directed to various methods, electronic components and circuitry which are involved in managing data within SSD storage based on recurring write quotas.

BRIEF DESCRIPTION OF THE DRAWINGS

The foregoing and other objects, features and advantages will be apparent from the following description of particular embodiments of the present disclosure, as illustrated in the accompanying drawings in which like reference characters refer to the same parts throughout the different views. The drawings are not necessarily to scale, emphasis instead being placed upon illustrating the principles of various embodiments of the present disclosure.

DETAILED DESCRIPTION

An improved technique is directed to managing data within solid state drive (SSD) storage based on recurring write quotas. In accordance with some embodiments, such write quotas are routinely (or periodically) allocated budgets for write operations for given amounts of time and may be based on a variety of measured (or counted) reliability and/or healthiness factors. Example factors include the number of read errors, the number of write errors, the number of unrecoverable errors, the number of faulted pages, write amplification metrics, and so on. Moreover, when a recurring write quota has been consumed for a particular SSD storage component (e.g., for a RAID group formed by multiple SSDs, for a single SSD, etc.), the data storage system may automatically perform a remedial activity such as block further write operations to that SSD storage component for an amount of time, direct write operations to an alternative SSD storage component to provide even wearing, alert a user, and so on.

Figure 1:
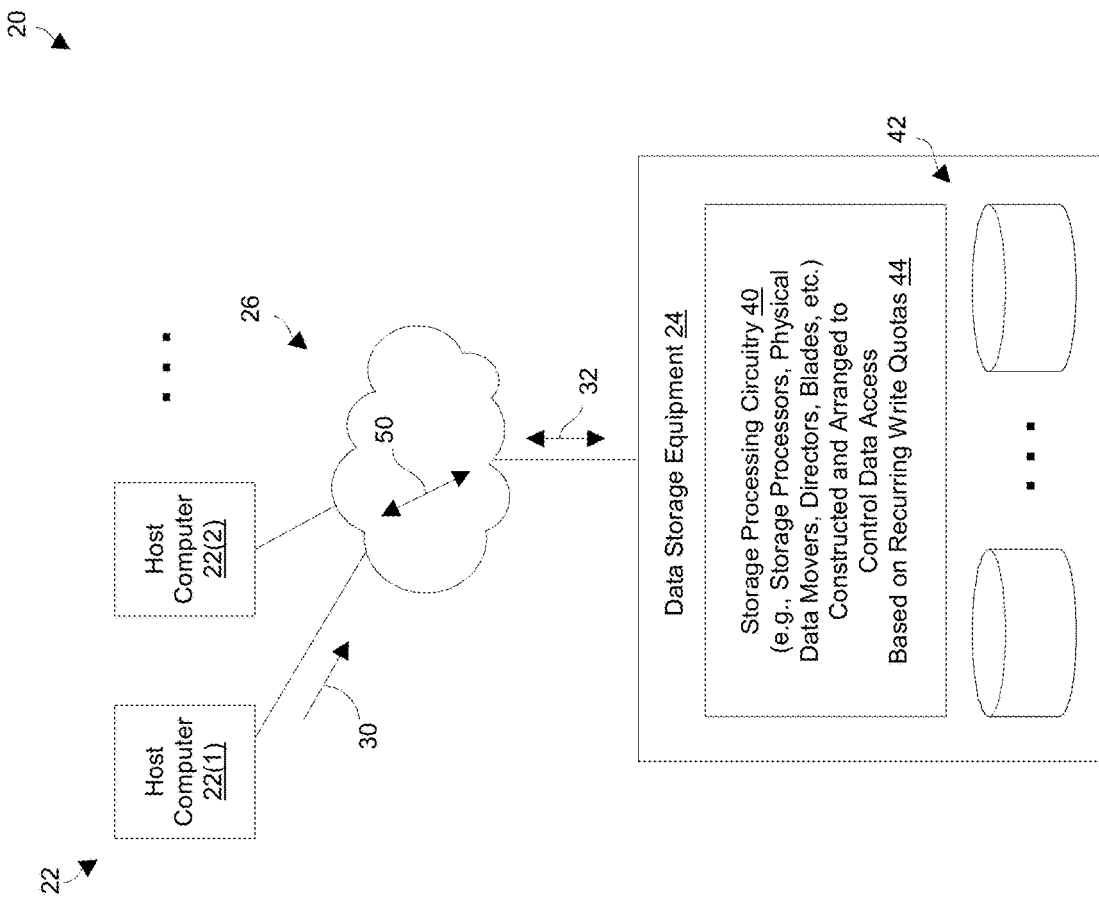
FIG. 1 is a block diagram of a data storage environment which manages data within solid state drive (SSD) storage based on recurring write quotas in accordance with certain example embodiments.

FIG. 1 shows a data storage environment 20 which manages data within solid state drive (SSD) storage based on recurring write quotas in accordance with certain example embodiments. The data storage environment 20 includes a set of host computers 22(1), 22(2), . . . (collectively, host computers 22), data storage equipment 24, and a communications medium 26.

Each host computer 22 is constructed and arranged to perform useful work. For example, a host computer 22 may operate as a web server, a file server, an email server, an enterprise server, combinations thereof, and so on, which provides I/O requests 30 (e.g., small computer system interface or SCSI commands) to the data storage equipment 24. Such I/O requests 30 direct the data storage equipment 24 to store and retrieve host data 32 on behalf of the host computers 22.

The data storage equipment 24 includes storage processing circuitry 40 and multiple SSD storage components 42 (illustrated using disk symbols in FIG. 1). The storage processing circuitry 40 may include one or more physical storage processors or engines, data movers, director boards, blades, I/O modules, storage drive controllers, switches, other hardware, combinations thereof, and so on. The storage processing circuitry 40 is constructed and arranged to provide a variety of data storage system services. For example, the storage processing circuitry 40 responds to the I/O requests 30 from the host computers 22 by robustly and reliably storing the host data 32 into and retrieving the host data 32 from the SSD storage components 42. Additionally, the storage processing circuitry 40 controls data access based on recurring write quotas 44. Accordingly, the data storage equipment 24 is able to enjoy certain efficiencies and optimizations such as even wearing of storage components, avoidance of exceeding endurance limits, enhanced monitoring, and so on.

Each SSD storage component 42 includes at least one solid state device to provide access to non-volatile storage which is faster (i.e., shorter response times) than that provided by hard disk drives (HDDs). In some embodiments, the data storage equipment 24 further includes other storage components such as HDDs that provide data access at speeds that are different from the SSD storage components 42. Such embodiments enable the data storage equipment 24 to store data within tiered storage and thus provide tiered storage services (e.g., auto-tiering, etc.).

The communications medium 26 is constructed and arranged to connect the various components of the data storage environment 20 together to enable these components to communicate via exchanging electronic signals 50 (e.g., see the double arrow 50). At least a portion of the communications medium 26 is illustrated as a cloud to indicate that the communications medium 26 is capable of having a variety of different topologies including backbone, hub-and-spoke, fabric, loop, irregular, combinations thereof, and so on. Along these lines, the communications medium 26 may include copper-based data communications devices and cabling, fiber optic communications devices and cabling, wireless communication devices, combinations thereof, etc. Furthermore, the communications medium 26 is capable of supporting SAN-based communications, LAN-based communications, cellular communications, WAN-based communications, distributed infrastructure communications, other topologies, combinations thereof, etc.

During operation, the storage processing circuitry 40 of the data storage equipment 24 writes host data 32 to the SSD storage components 42 and reads host data 32 from the SSD storage components 42 in response to the I/O requests 30. Additionally, storage processing circuitry 40 consumes/updates the recurring write quotas 44 for the SSD storage components 42 in response to writing data to the SSD storage components 42. As will be explained further detail shortly, each recurring write quota 44 identifies an amount of remaining usefulness for a respective SSD storage component 42.

Additionally, the storage processing circuitry 40 performs quota evaluation operations to evaluate the recurring write quotas as the recurring write quotas 44 are consumed. In response to results from the quota evaluation operations (e.g., results indicating that recurring write quotas 44 for particular SSD storage components 42 have been fully consumed), the storage processing circuitry 40 performs remedial activities to control access to the data that was written to the SSD storage components 42. Along these lines, the storage processing circuitry 40 may temporarily direct write operations to different SSD storage components 42 (e.g., SSD storage components 42 that have remaining write operations before their budgets are fully consumed) to provide even wearing, alert a user, combinations thereof, and so on. Further details will now be provided with reference to FIG. 2.

Figure 2:
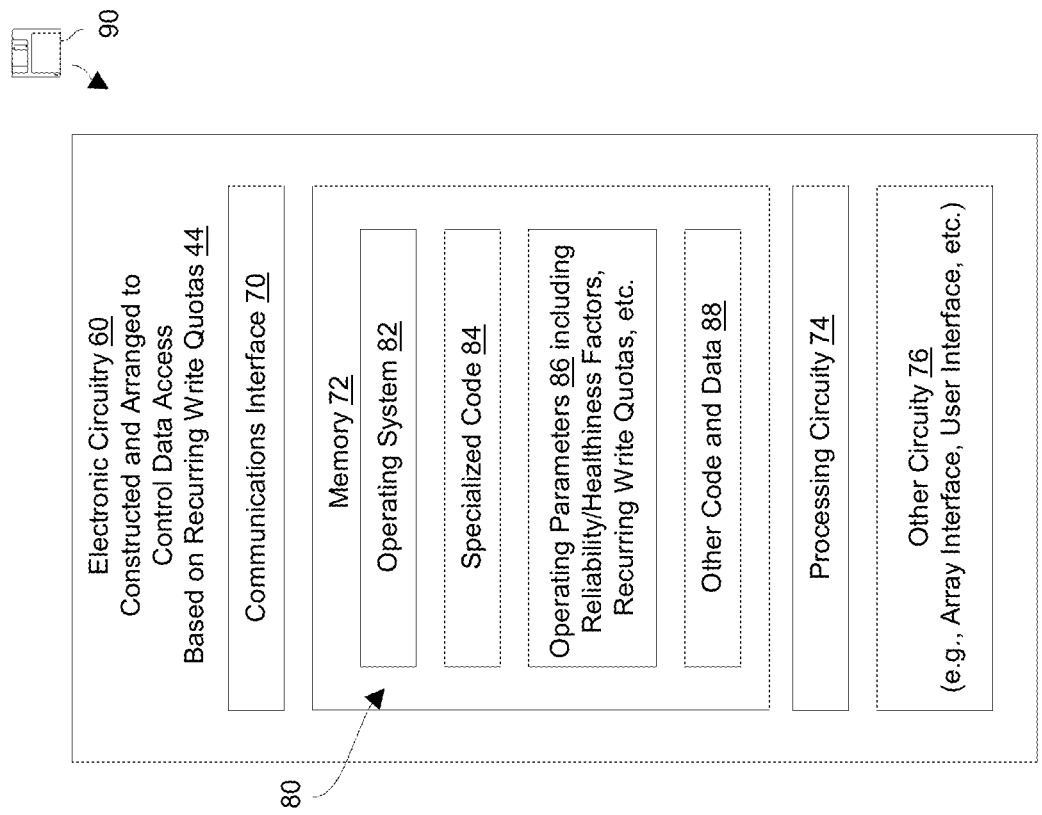
FIG. 2 is a block diagram of data storage equipment of the data storage environment of FIG. 1 in accordance with certain example embodiments.

FIG. 2 shows an electronic circuitry 60 which is suitable for the storage processing circuitry 40 of FIG. 1 that manages data within SSD storage based on recurring write quotas 44 in accordance with certain example embodiments. As shown, the electronic circuitry 60 includes a communications interface 70, memory 72, processing circuitry 74, and other circuitry 76.

The communications interface 70 is constructed and arranged to connect the data storage equipment 24 to the communications medium 26 (also see FIG. 1) to enable electronic communications with other devices of the data storage environment 20 (e.g., the host computers 22). Such communications may be SAN-based, IP-based, cellular-based, cable-based, fiber-optic based, wireless, cloud-based, combinations thereof, and so on. Accordingly, the communications interface 70 enables the data storage equipment 24 to robustly and reliably communicate with other apparatus.

The memory 72 is intended to represent both volatile storage (e.g., DRAM, SRAM, etc.) and non-volatile storage (e.g., flash memory, magnetic memory, etc.). In some arrangements, the memory 72 utilizes a portion of the SSD storage components 42 (FIG. 1). The memory 72 stores a variety of software constructs 80 including operating system code 82, specialized code 84, operating parameters 86, as well as other code and data 88.

The operating system code 82 refers to an operating system which is involved in controlling various electronic resources of the data storage equipment 24. Along these lines, the operating system manages/allocates various electronic resources such as processor cycles, memory space, application installations, access control and privileges, and so on.

The specialized code 84 refers to the instructions that are involved in data storage operations (e.g., write and read operations) as well as other operations such as managing access to the SSD storage components 42 based on recurring write quotas 44. The specialized code 84 may include operating variables and data structures, drivers, other metadata, etc. that form one or more portions of the I/O stack, mapping tables, and so on. In some arrangements, the specialized code 84 is tightly integrated with the operating system code 82 (e.g., a kernel).

The operating parameters 86 refers to reliability/healthiness factors, rules that guide remedial activities, the recurring write quotas 44, evaluation results, and so on. At least some of the parameters 86 may be predefined prior to electronic circuitry operation while other parameters are generated and updated over time during electronic circuitry operation.

The other code and data 88 refers to various other instructions, parameters, data, etc. For example, the electronic circuitry 60 may be equipped with other tools and utilities, user-level applications, and so on.

The processing circuitry 74 is constructed and arranged to operate in accordance with the various software constructs 80 stored in the memory 72. As will be explained in further detail shortly, the processing circuitry 74 executes code of the various software constructs 80 to form specialized circuitry that concurrently carries out data storage operations as well as manages access to the SSD storage components 42 based on the recurring write quotas 44.

Such processing circuitry 74 may be implemented in a variety of ways including via one or more processors (or cores) running specialized software, application specific ICs (ASICs), field programmable gate arrays (FPGAs) and associated programs, discrete components, analog circuits, other hardware circuitry, combinations thereof, and so on. In the context of one or more processors executing software, a computer program product 90 is capable of delivering all or portions of the software constructs 80 to the electronic circuitry 60. In particular, the computer program product 90 has a non-transitory (or non-volatile) computer readable medium which stores a set of instructions which controls one or more operations of the electronic circuitry 60. Examples of suitable computer readable storage media include tangible articles of manufacture and apparatus which store instructions in a non-volatile manner such as CD-ROM, DVD, flash memory, disk memory, tape memory, and the like.

The other circuitry 76 represents additional hardware. For example, the other circuitry 76 may include a storage drive (or array) interface to communicate with the SSD storage components 42, HDDs, and so on (e.g., via SATA, SAS, PCIe, etc.). As another example, the other circuitry 76 may include a user terminal or service processor that enables a human user to control and/or configure the data storage equipment 24, and so on. Further details will now be provided with reference to FIGS. 3 and 4.

Figure 3:
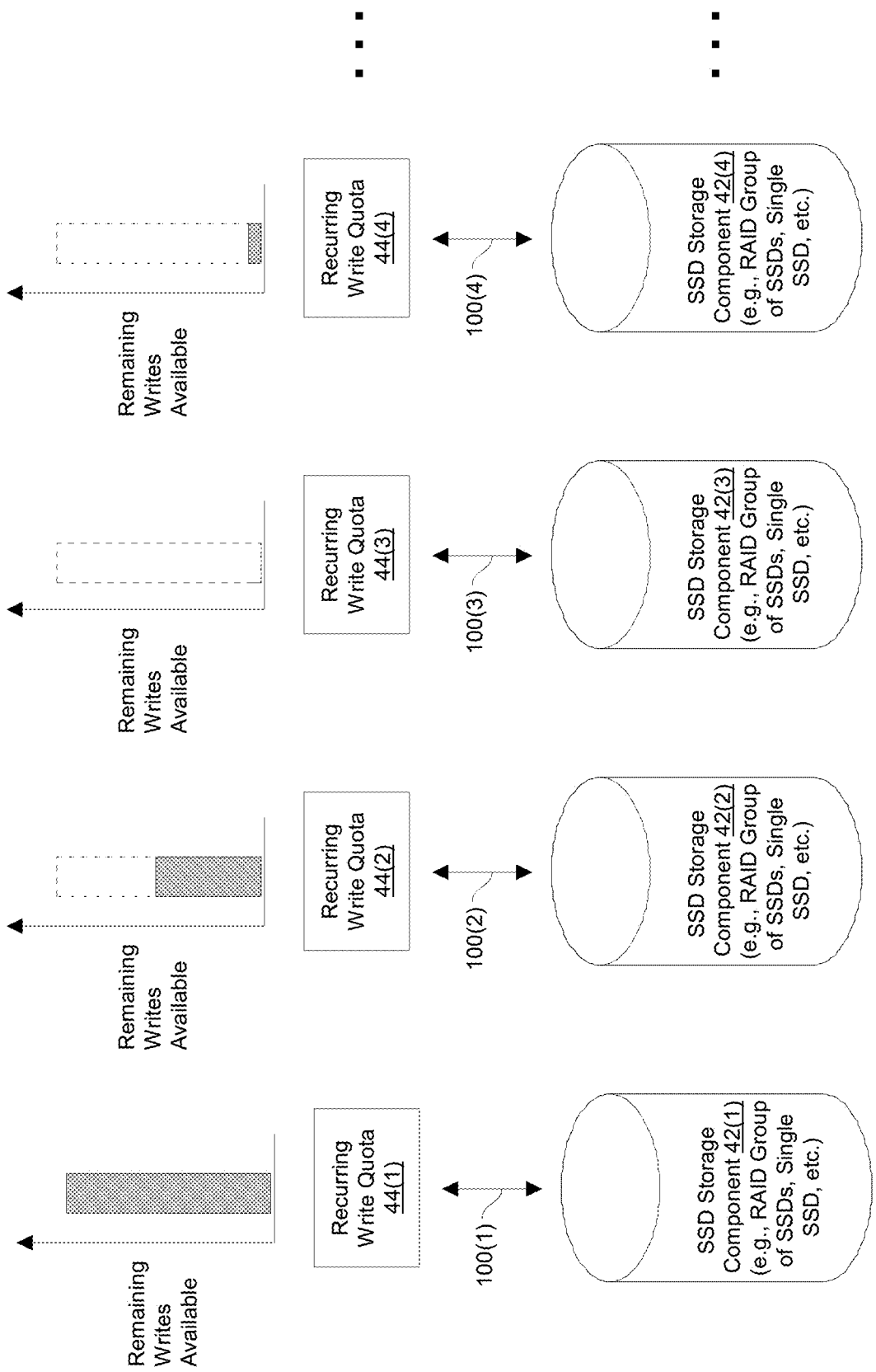
FIG. 3 is a block diagram illustrating particular recurring write quota details in accordance with certain example embodiments.
Figure 4:
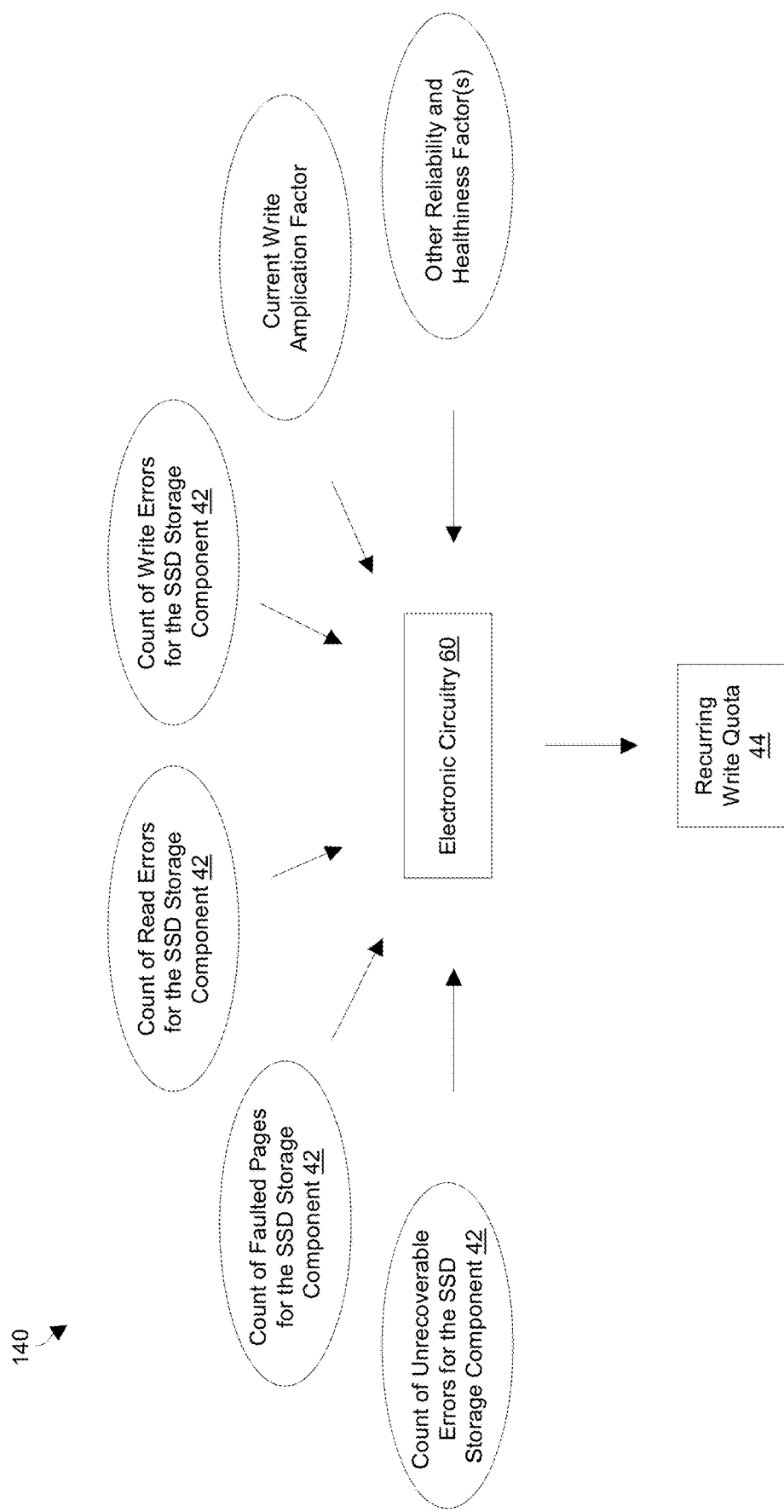
FIG. 4 is a block diagram illustrating other particular recurring write quota details in accordance with certain example embodiments.

FIGS. 3 and 4 show particular recurring write quota details in accordance with certain example embodiments. FIG. 3 shows the relationship between the recurring write quotas 44 and the SSD storage components 42. FIG. 4 shows how the recurring write quotas 44 are generated (or derived) for the SSD storage components 42.

As shown in an example situation in FIG. 3, the electronic circuitry 60 maintains a recurring write quota 44 for each SSD storage component 42. As mentioned earlier, each SSD storage component 42 includes at least one solid state device. In some situations, a SSD storage component 42 includes multiple SSDs configured as a RAID group that provide additional fault tolerance (e.g., the ability to recover or reconstruct data that was stored on a failed SSD).

At this point, one should appreciate that SSDs have limits to number of times they can be written. Such limits may be specified by the SSD manufacturer as the number of program-erase cycles that the pages of the SSDs are able to perform (or withstand) before the SSDs are no longer confidently writable. For example, the manufacturer for a particular single-level cell (SLC) SSD may specify that each page of the particular SLC SSD is able to perform between 90,000 to 100,000 write cycles. As another example, the manufacturer for a particular enterprise multi-level cell (eMLC) SSD may specify that each page of the particular eMLC SSD is able to perform between 20,000 to 30,000 write cycles. As yet another example, the manufacturer for a standard multi-level cell (MLC) SSD may specify that each page of the standard MLC SSD is able to perform around 10,000 write cycles, and so on. One should further appreciate that the specified number of PE cycles may vary from one manufacturer or vender to another, and may be based on actual test results.

It should be further understood that the recurring write quotas 44 may be based, at least in part, on the specified number of PE cycles. For example, suppose that each SSD storage component 42 is an individual eMLC SSD having pages that are spec'd to perform 20,000 PE cycles. Further suppose that the operator of the data storage equipment 24 plans to utilize the SSD storage components 42 for 5 years. In such a situation, each SSD storage component 42 may support an average of 4,000 PE-cycles per year (or just under 11 PE-cycles per day). Also suppose that the operator understands that, due to write amplification, each write to an SSD storage component 42 typically results in twice as many writes and thus discounts the number of PE-cycles per day from 11 PE-cycles per day to 5 PE-cycles per day.

With these characteristics in mind, the operator may specify a maximum recurring write quota of 5 PE-cycles per day for each SSD storage component 42 that exhibits normal error behavior. The operator may further specify a higher maximum recurring write quota of 10 PE-cycles per day for each SSD storage component 42 that exhibits little or no error behavior.

Accordingly and as shown in FIG. 3, the electronic circuitry 60 maintains respective recurring write quotas 44 for the SSD storage components 42. In particular, the recurring write quota 44(1) is a numerical measure (or budget) of remaining PE usefulness for the SSD storage component 42(1). Similarly, the recurring write quota 44(2) is a numerical measure of remaining PE usefulness for the SSD storage component 42(3). Likewise, the recurring write quota 44(3) is a numerical measure of remaining PE usefulness for the SSD storage component 42(3), and the recurring write quota 44(4) is a numerical measure of remaining PE usefulness for the SSD storage component 42(4), and so on.

It should be understood that the recurring write quotas 44 are write allocations for writes to the same page for a given period of time. Suitable periods of time include a week, a day, an hour, 30 minutes, etc. For example, the electronic circuitry 60 may initially allocate a particular SSD storage component 42 a recurring write quota 44 of 10 page write cycles per day. Then, the electronic circuitry 60 updates the recurring write quota 44 for the particular SSD storage component 42 as the electronic circuitry 60 puts the particular SSD storage component 42 through page write cycles during that data. Accordingly, after each page of the particular SSD storage component 42 has been written to say 3 times in a particular day, the recurring write quota 42 that was initially 10 is now 7 for that SSD storage component 42 during that day (i.e., the recurring write quota 42 has been reduced by 3).

Eventually, if there are a total of 10 write cycles performed by that SSD storage component 42, the electronic circuitry 60 may continue to update the recurring write quota 42 for that SSD storage component 42 until the recurring write quota 42 has been fully consumed. At this point, the electronic circuitry 60 performs a remedial action such as providing an alert to the operator (or user) indicating that the SSD storage component 42 is being fully utilized. In some arrangements, the electronic circuitry 60 does not block further write cycles by the particular SSD storage component 42 and the alert simply operates as an indicator that the SSD storage component 42 will reach its specified number of PE-cycles earlier than planned. Alternatively, when the recurring write quota 42 for that SSD storage component 42 has been fully consumed, the electronic circuitry 60 may block further writes to that SSD storage component 42 and satisfy further writes during that day by directing the writes to a different SSD storage component 42 that has not fully consumed its recurring write quota 42 thus preventing excessive wear and over-utilization of the particular SSD storage component 42.

By way of example only and as shown in FIG. 3, the recurring write quotas 44(1), 44(2), 44(3), 44(4), . . . show the remaining PE-cycle budgets left for the SSD storage components 42(1), 42(2), 42(3), 42(4), . . . . It should be understood that the number of PE-cycles performed by each SSD storage components 42 of the data storage equipment 24 may vary since the SSD storage components 42 may store different data and may be accessed by different hosts, applications, etc.

In particular, the recurring write quota 44(1) for the SSD storage component 42(1) is not consumed at all. This may mean that the electronic circuitry 60 has not performed any PE-cycles on the SSD storage component 42(1) yet during the current time period (e.g., the current day).

Additionally, the recurring write quota 44(2) for the SSD storage component 42(2) is half consumed meaning that the allocated number of writes-cycles for the SSD storage component 42(2) has been half consumed and there is another half that is unconsumed for further write cycles for the rest of the current time period (e.g., the rest of the current day).

Furthermore, the recurring write quota 44(3) for the SSD storage component 42(3) is fully consumed meaning that there are no write cycles left in the budget for the SSD storage component 42(3) for the current time period. In this situation, the electronic circuitry 60 performs a remedial action such as alerting the operator, blocking further write operations to the SSD storage component 42(3) for the rest of the current time period, combinations thereof, etc. For example, any write operations that were directed to the SSD storage component 42(3) during the current time period (i.e., while the recurring write quota 44(3) remains fully consumed) may be steered to the SSD storage component 42(1) until the current time period expires.

Also, the recurring write quota 44(4) for the SSD storage component 42(4) is mostly consumed meaning that there are not many write cycles left in the budget for the SSD storage component 42(4). In some arrangements, the electronic circuitry 60 may provide an alert and/or re-direct writes to different SSD storage component 42 even if the recurring write quota 44 is not fully consumed.

It should be understood that once the current time period has expired, the electronic circuitry 60 regenerates or resets the recurring write quota 44 for each SSD storage component 42 to the full recurring write quota 44. At this time, if writes had been blocked to certain SSD storage components 42 because their recurring write quotas 44 had been fully consumed during the earlier time period, the writes are now unblocked thus again enabling writes to those SSD storage components 42.

The electronic circuitry 60 may repeat this process routinely (e.g., daily) thus enabling the data storage equipment 24 to more evenly wear the SSD storage components 42. Moreover, any alerts to the operator enables the operator to modify how the SSD storage components 42 to improve the ability of the SSD storage components 42 to safely reach the planned lifetime before reaching the PE-cycle limits.

As shown in FIG. 4, the electronic circuitry 60 derives the recurring write quota 44 for each SSD storage component 42 based on a variety of reliability and healthiness factors 140. Such reliability and healthiness factors 140 may include but are not limited to (i) a count of unrecoverable errors for each SSD storage component of the set of SSD storage components, (ii) a count of faulted pages for each SSD storage component of the set of SSD storage components, (iii) a count of read errors for each SSD storage component of the set of SSD storage components, (iv) a count of write errors for each SSD storage component of the set of SSD storage components, and (v) a current write amplification factor for each SSD storage component of the set of SSD storage components, combinations thereof, and so on. Other factors are suitable for use as well such as knowledge of how soon the SSD storage components will be replaced, knowledge of whether the SSD storage component 42 stores host data, metadata, applications, a database, and so on.

One should appreciate that the degree of write amplification that occurs within SSDs may be based on how particular write patterns affect certain operations such as wear leveling, garbage collection, etc. Accordingly, the amount (or degree) of write amplification may be considered a factor that affects SSD reliability/health due to its impact on SSD wear.

It should be understood that the internal circuitry of an SSD may sense, track, tally, and operate based on a variety of criteria. In traditional SSDs, some of this criteria may not normally be made available externally (e.g., for querying by external circuitry). However, such SSDs may easily be adapted to output such criteria for use by external circuitry to enable more effective wear leveling among SSDs using the recurring write quotas 44 disclosed herein.

It should be further understood that the recurring write quota 44 that the electronic circuitry 60 generates for one SSD storage component 42 may be significantly different than the recurring write quota 44 that the electronic circuitry 60 generates for another SSD storage component 42. For example, for a healthy SSD storage component 42 that exhibit little or no faults, the electronic circuitry 60 may provide a relatively high recurring write quota 44 such as 10 write-cycles per day. On the other hand, for an unhealthy SSD storage component 42 that exhibit many faults, the electronic circuitry 60 may provide a relatively low recurring write quota 44 such as 3 write-cycles per day, and so on. Further details will now be provided with reference to FIG. 4.

Figure 5:
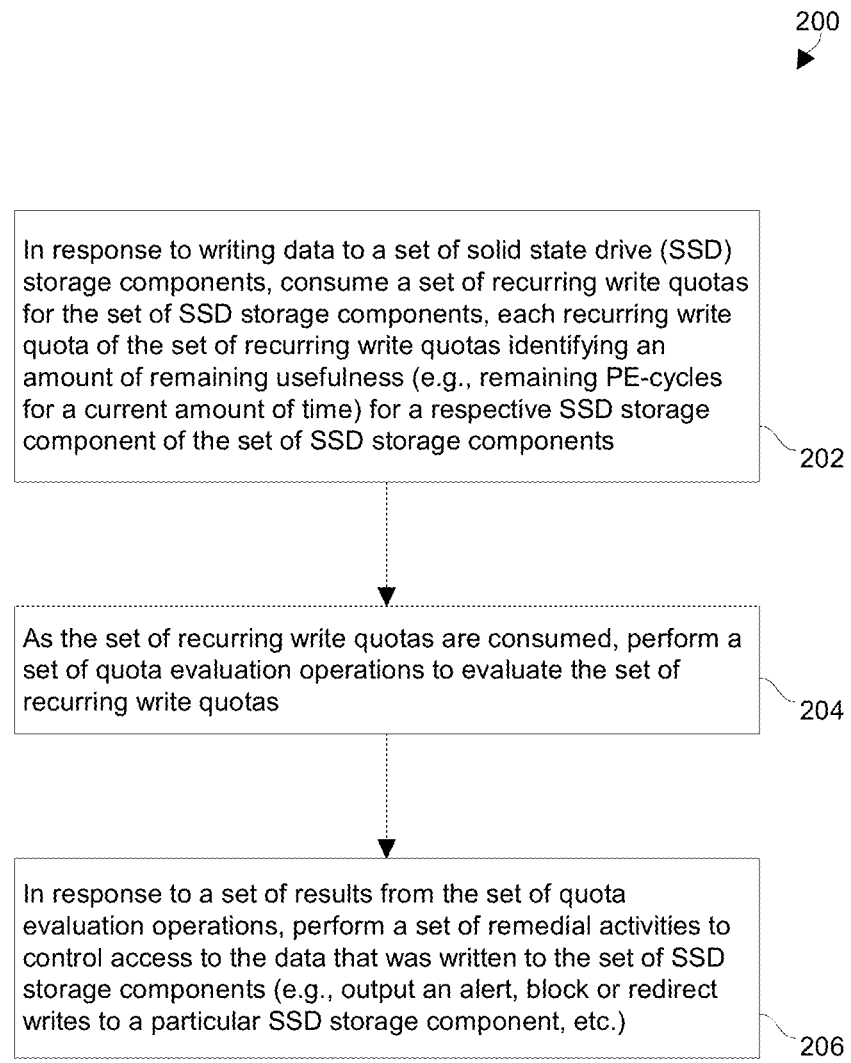
FIG. 5 is a flowchart of a procedure which is performed by the data storage equipment of FIG. 2.

FIG. 5 is a flowchart of a procedure 200 which is performed by the data storage equipment 24 when managing data within SSD to improve SSD performance (e.g., to provide more even wear).

At 202, the data storage equipment 24, in response to writing data to a set of SSD storage components, consumes a set of recurring write quotas for the set of SSD storage components. Each recurring write quota of the set of recurring write quotas identifies an amount of remaining usefulness (e.g., a budget of PE-cycles for a current time period) for a respective SSD storage component of the set of SSD storage components.

At 204, the data storage equipment 24, as the set of recurring write quotas are consumed, performs a set of quota evaluation operations to evaluate the set of recurring write quotas. Here, the data storage equipment 24 gauges how close or even flags when a recurring write quota for a particular SSD storage component has been fully consumed.

At 206, the data storage equipment 24, in response to a set of results from the set of quota evaluation operations, performs a set of remedial activities to control access to the data that was written to the set of SSD storage components. For example, the data storage equipment 24 may notify the operator of a fully consumed recurring write quota for a particular SSD storage component, the data storage equipment 24 may block or redirect further writes to the particular SSD storage component, combinations thereof, etc.

In accordance with certain embodiments, the data storage equipment 24 re-derives the recurring write quota 44 for each SSD storage component 42 when the current time period expires. In some arrangements, one or more of the input parameters for a particular SSD storage component 42 (e.g., see FIG. 4) may change over time and thus the data storage equipment 24 may derive a different value for the recurring write quota 44 for the particular SSD storage component 42 for a new time period. Such operation enables the data storage equipment 24 to adapt to changing operation of the SSD storage components 42 during their lifecycle.

As described above, improved techniques are directed to managing data within SSD storage based on recurring write quotas 44. Such write quotas 44 are allocated budgets for write operations for a given time period and may be based on a variety of measured (or counted) reliability and/or healthiness factors. Example factors include the number of read errors, the number of write errors, the number of unrecoverable errors, the number of faulted pages, write amplification metrics, and so on. Moreover, when a recurring write quota has been consumed for a particular SSD storage component 42 (e.g., for a RAID group formed by multiple SSDs, for a single SSD, etc.), the data storage equipment 24 may automatically perform a remedial activity such as block further write operations to that SSD storage component 42 for an amount of time, direct write operations to an alternative SSD storage component 42 to provide even wearing, alert a user, and so on.

While various embodiments of the present disclosure have been particularly shown and described, it will be understood by those skilled in the art that various changes in form and details may be made therein without departing from the spirit and scope of the present disclosure as defined by the appended claims.

For example, it should be understood that various components of the data storage environment 20 such as the host computers 22 are capable of being implemented in or "moved to" the cloud, i.e., to remote computer resources distributed over a network. Here, the various computer resources may be distributed tightly (e.g., a server farm in a single facility) or over relatively large distances (e.g., over a campus, in different cities, coast to coast, etc.). In these situations, the network connecting the resources is capable of having a variety of different topologies including backbone, hub-and-spoke, loop, irregular, combinations thereof, and so on. Additionally, the network may include copper-based data communications devices and cabling, fiber optic devices and cabling, wireless devices, combinations thereof, etc. Furthermore, the network is capable of supporting LAN-based communications, SAN-based communications, combinations thereof, and so on.

Additionally, in some arrangements, a SSD storage component 42 includes multiple SSDs. In these arrangements, the electronic circuitry 60 may take, as the reliability and healthiness factors (also see FIG. 4) for the SSD storage component 42, the worst factor of all of the SSDs.

One should appreciate that the above-described techniques do not merely store data in SSDs. Rather, the disclosed techniques involve improvements to the technology. Along these lines, with the above-described techniques, the data storage equipment 24 is able to control wear among SSDs. Moreover, the data storage equipment 24 is able to identify which SSDs are healthy and extend the useful life of the healthy SSDs beyond the prescribed PE-cycles that are provided for worst case, unhealthy SSDs. Other advantages are available as well such as dynamic adjustments made to the data storage equipment in response to changing SSD behaviors, and so on.

It should be understood that a thin LUN involves mapping different regions of its address space to different regions of the physical space available from the drives (RAID groups) provisioned to the array. Additionally, an application may access the different parts of this logical space, but not equally. Rather, there may be spatial and temporal localities for such access over the time. Therefore, in the general case, the amount of IOs coming to the different regions of the physical space and the corresponding drives is not even as well. Instead, it can be different in the amount of operations, in the nature of the operations (reads, writes or some mixture of reads and writes), block size, etc.

Furthermore, flash memory drives should sustain the vendor-specified number of writes cycles throughout their life time. It is expected that SSDs are going to fail soon after that. This maximum number depends on the used technology and there is a trend to use flash memory drives with less number of supported writes per day. Thus the drives, which hold the physical regions of space mapped to the logical regions with higher write rate, could be worn out before the end of their warranty period, which is not good. In fact, it is undesirable for SSDs to fault prematurely and somewhat useful to use drive endurance as the measure of its faultiness. Unfortunately, conventional wear balancing techniques tackle this issue only indirectly. Moreover maximum number of cycles is set by the SSD vendor for the worst case for all the drives of the same type. However, there are recent studies showing that in reality this number is 3 times higher at least.

In contrast, certain embodiments disclosed herein utilize recurring write quotas based on faultiness to avoid drive failure. Such utilization prevents drives from failing during their warranty period directly, and adapts to the different endurance and reliability characteristics of the drives naturally. In particular, circuitry monitors the faultiness/reliability characteristic for every SSD or SSD group. Such characteristics can be obtained from the parameters of the SSD (e.g., reading status from the SSD). Examples of such SSD health data include the number of faults of different types, age and other parameters impacting the reliability of the drive, and so on. The circuitry then calculates the correlation between number of written bytes to the drive and the corresponding increase in the faultiness (as endurance is the main factor in the reliability). Having a faultiness threshold (after which the drive is considered to be failed finally) and the period of time desired for the drive to operate in service, the recurring write quota can be calculated.

Accordingly, the recurring write quota limits the amount of allowed writes to the drive, i.e., the circuitry prevents the drive from exceeding its write quota. As a result, no drive in the array will fail before the end of the warranty period.

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document. Such modifications and enhancements are intended to belong to various embodiments of the disclosure.

What is claimed is:

1. A method of managing data within solid state drive (SSD) storage, the method comprising:
   in response to writing data to a set of SSD storage components, consuming a set of recurring write quotas for the set of SSD storage components, each recurring write quota of the set of recurring write quotas identifying an amount of remaining usefulness for a respective SSD storage component of the set of SSD storage components, wherein a particular recurring write quota for a particular SSD storage component initially is a numerical write measurement for the particular SSD storage component budgeted for a predefined time period;
   as the set of recurring write quotas are consumed, performing a set of quota evaluation operations to evaluate the set of recurring write quotas;
   in response to a set of results from the set of quota evaluation operations, performing a set of remedial activities to control access to the data that was written to the set of SSD storage components, wherein performing the set of remedial activities to control access to the data that was written to the set of SSD storage components includes blocking performance of further write operations to the particular SSD storage component during a remainder of the predefined time period; and
   upon expiration of the predefined time period and onset of a new predefined time period, (i) setting the particular recurring write quota for the particular SSD storage component back to the numerical write measurement budgeted for the new predefined time period and (ii) unblocking performance of further write operations to the particular SSD storage component.

2. A method as in claim 1, further comprising:
   prior to consuming the set of recurring write quotas, generating the set of recurring write quotas based on a set of predefined program-erase (PE) cycle counts for the set of SSD storage components, each predefined PE cycle count identifying a predefined number of PE cycles to be performed on a respective SSD storage component of the set of SSD storage components; and
   wherein each recurring write quota is a numerical measure of remaining PE usefulness for a respective SSD storage component of the set of SSD storage components.

3. A method as in claim 2 wherein performing the set of quota evaluation operations to evaluate the set of recurring write quotas further includes:
   providing a particular alert that the particular recurring write quota for the particular SSD storage component has been fully consumed.

4. A method as in claim 3 wherein
   blocking the performance of further write operations is performed in response to the particular alert.

5. A method as in claim 3 wherein performing the set of remedial activities to control access to the data that was written to the set of SSD storage components further includes:
   outputting a notification to a user indicating that write operations to the particular SSD storage component within the predefined time period exceeded the numerical write measurement for the particular SSD storage component budgeted for the predefined time period.

6. A method as in claim 2 wherein generating the set of recurring write quotas includes:
   deriving the set of recurring write quotas based on a set of healthiness factors for the set of SSD storage components, each healthiness factor indicating whether a respective SSD storage component is healthy.

7. A method as in claim 6, further comprising:
   providing the set of healthiness factors based on a count of unrecoverable errors for each SSD storage component of the set of SSD storage components.

8. A method as in claim 6, further comprising:
   providing the set of healthiness factors based on a count of faulted pages for each SSD storage component of the set of SSD storage components.

9. A method as in claim 6, further comprising:
   providing the set of healthiness factors based on a count of read errors for each SSD storage component of the set of SSD storage components.

10. A method as in claim 6, further comprising:
    providing the set of healthiness factors based on a count of write errors for each SSD storage component of the set of SSD storage components.

11. A method as in claim 6, further comprising:
    providing the set of healthiness factors based on a current write amplification factor for each SSD storage component of the set of SSD storage components.

12. A method as in claim 6, further comprising:
    providing the set of healthiness factors based on (i) a count of unrecoverable errors for each SSD storage component of the set of SSD storage components, (ii) a count of faulted pages for each SSD storage component of the set of SSD storage components, (iii) a count of read errors for each SSD storage component of the set of SSD storage components, (iv) a count of write errors for each SSD storage component of the set of SSD storage components, and (v) a current write amplification factor for each SSD storage component of the set of SSD storage components.

13. A method as in claim 6, further comprising:
after a predefined period of operation has passed since generating the set of recurring write quotas, replacing the set of recurring write quotas with a set of newly-generated recurring write quotas based on a set of updated healthiness factors for the set of SSD storage components, each updated healthiness factor indicating whether a respective SSD storage component is currently healthy.

14. A method as in claim 13 wherein each SSD storage component includes multiple SSD storage units configured as a redundant array of independent devices (RAID) group.

15. A method as in claim 13 wherein each SSD storage component includes exactly one SSD storage unit.

16. A method as in claim 1 wherein the particular SSD storage component is a page; and
wherein the numerical write measurement for the particular SSD storage component budgeted for the predefined time period is a write allocation for write operations to the page for the predefined time period.

17. Data storage equipment, comprising:
a storage component interface operative to communicate with a set of solid state drive (SSD) storage components;
memory; and
control circuitry coupled to the storage component interface and the memory, the memory storing instructions which, when carried out by the control circuitry, cause the control circuitry to:
in response to writing data to the set of SSD storage components through storage component interface, consume a set of recurring write quotas for the set of SSD storage components, each recurring write quota of the set of recurring write quotas identifying an amount of remaining usefulness for a respective SSD storage component of the set of SSD storage components, wherein a particular recurring write quota for a particular SSD storage component initially is a numerical write measurement for the particular SSD storage component budgeted for a predefined time period,
as the set of recurring write quotas are consumed, perform a set of quota evaluation operations to evaluate the set of recurring write quotas,
in response to a set of results from the set of quota evaluation operations, perform a set of remedial activities to control access to the data that was written to the set of SSD storage components, wherein performing the set of remedial activities to control access to the data that was written to the set of SSD storage components includes blocking performance of further write operations to the particular SSD storage component during a remainder of the predefined time period; and
upon expiration of the predefined time period and onset of a new predefined time period, (i) set the particular recurring write quota for the particular SSD storage component back to the numerical write measurement budgeted for the new predefined time period and (ii) unblock performance of further write operations to the particular SSD storage component.

18. Data storage equipment as in claim 17 wherein the control circuitry is further constructed and arranged to:
prior to consuming the set of recurring write quotas, generate the set of recurring write quotas based on a set of predefined program-erase (PE) cycle counts for the set of SSD storage components, each predefined PE cycle count identifying a predefined number of PE cycles to be performed on a respective SSD storage component of the set of SSD storage components; and
wherein each recurring write quota is a numerical measure of remaining PE usefulness for a respective SSD storage component of the set of SSD storage components.

19. Data storage equipment as in claim 18 wherein performing the set of quota evaluation operations to evaluate the set of recurring write quotas further includes:
providing a particular alert that the particular recurring write quota for the particular SSD storage component has been fully consumed; and
wherein blocking the performance of further write operations is performed in response to the particular alert.

20. A computer program product having a non-transitory computer readable medium which stores a set of instructions to manage data within solid state drive (SSD) storage; the set of instructions, when carried out by computerized circuitry, causing the computerized circuitry to perform a method of:
in response to writing data to a set of SSD storage components, consuming a set of recurring write quotas for the set of SSD storage components, each recurring write quota of the set of recurring write quotas identifying an amount of remaining usefulness for a respective SSD storage component of the set of SSD storage components, wherein a particular recurring write quota for a particular SSD storage component initially is a numerical write measurement for the particular SSD storage component budgeted for a predefined time period;
as the set of recurring write quotas are consumed, performing a set of quota evaluation operations to evaluate the set of recurring write quotas; and
in response to a set of results from the set of quota evaluation operations, performing a set of remedial activities to control access to the data that was written to the set of SSD storage components, wherein performing the set of remedial activities to control access to the data that was written to the set of SSD storage components includes blocking performance of further write operations to the particular SSD storage component during a remainder of the predefined time period; and
upon expiration of the predefined time period and onset of a new predefined time period, (i) setting the particular recurring write quota for the particular SSD storage component back to the numerical write measurement budgeted for the new predefined time period and (ii) unblocking performance of further write operations to the particular SSD storage component.

* * * * *